United States Patent
Deng et al.

(10) Patent No.: US 9,252,033 B2
(45) Date of Patent: Feb. 2, 2016

(54) INSTALLATION DEVICE AND ELECTRONIC APPARATUS

(75) Inventors: Ting-Hui Deng, Shenzhen (CN); Cai-Jie Li, Shenzhen (CN); Ji-Ping Wu, Shenzhen (CN); Long-Fong Chen, New Taipei (TW); Chung-Yuan Chen, New Taipei (TW)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 825 days.

(21) Appl. No.: 13/564,778

(22) Filed: Aug. 2, 2012

(65) Prior Publication Data

US 2013/0168021 A1    Jul. 4, 2013

(30) Foreign Application Priority Data

Dec. 29, 2011  (CN) .......................... 2011 1 0450570

(51) Int. Cl.
*B23P 19/00* (2006.01)
*H01L 21/67* (2006.01)

(52) U.S. Cl.
CPC .... *H01L 21/67132* (2013.01); *H01L 21/67011* (2013.01); *H01L 21/67121* (2013.01); *Y10T 29/4913* (2015.01); *Y10T 29/53174* (2015.01)

(58) Field of Classification Search
CPC .................. Y10T 29/53174; Y10T 29/4913; Y10T 156/1744; H05K 13/04; H05K 3/00
USPC ........ 29/759, 25.01, 739, 740, 743, 786, 794, 29/832.833; 156/64, 297, 298
See application file for complete search history.

(56) References Cited

U.S. PATENT DOCUMENTS 5,855,059 A * 1/1999 Togami et al. .................. 29/740
6,793,749 B2 * 9/2004 Fogal et al. ..................... 156/64

* cited by examiner

*Primary Examiner* — Thiem Phan
(74) *Attorney, Agent, or Firm* — Novak Druce Connolly Bove + Quigg LLP

(57) ABSTRACT

An automatic installation device for automatic procuring and fixing an object to a product is mounted on a base. The automatic installation device comprises an elevating mechanism, a loading mechanism for procuring the object, and a flexing mechanism connected between the elevating mechanism and the loading mechanism. The flexing mechanism is capable of driving the loading mechanism moving between the object and the product for aligning the object with the product in a first orientation. The elevating mechanism is capable of driving the loading mechanism to move in a second orientation perpendicular to the first orientation to drive the loading mechanism moving adjacent to the product and fixing the object to the product.

17 Claims, 6 Drawing Sheets

INSTALLATION DEVICE AND ELECTRONIC APPARATUS

BACKGROUND

1. Technical Field

The present disclosure relates to automatic installation devices, and particularly to an electronic apparatus using an automatic installation device.

2. Description of Related Art

In the assembling process of an electronic device, the VHB (very high bonding) double faced adhesive tape for gluing a first component and a second component together is applied manually. A protecting paper of the VHB double faced adhesive tape defines a positioning hole, and a screw extends through the positioning hole for fixing the VHB double faced adhesive tape on the first component. Then, the operator manually glues the second component to the VHB double faced adhesive tape to fix the second component to the first component. However, this manual procedure is time-consuming and complicated.

Therefore, there is room for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
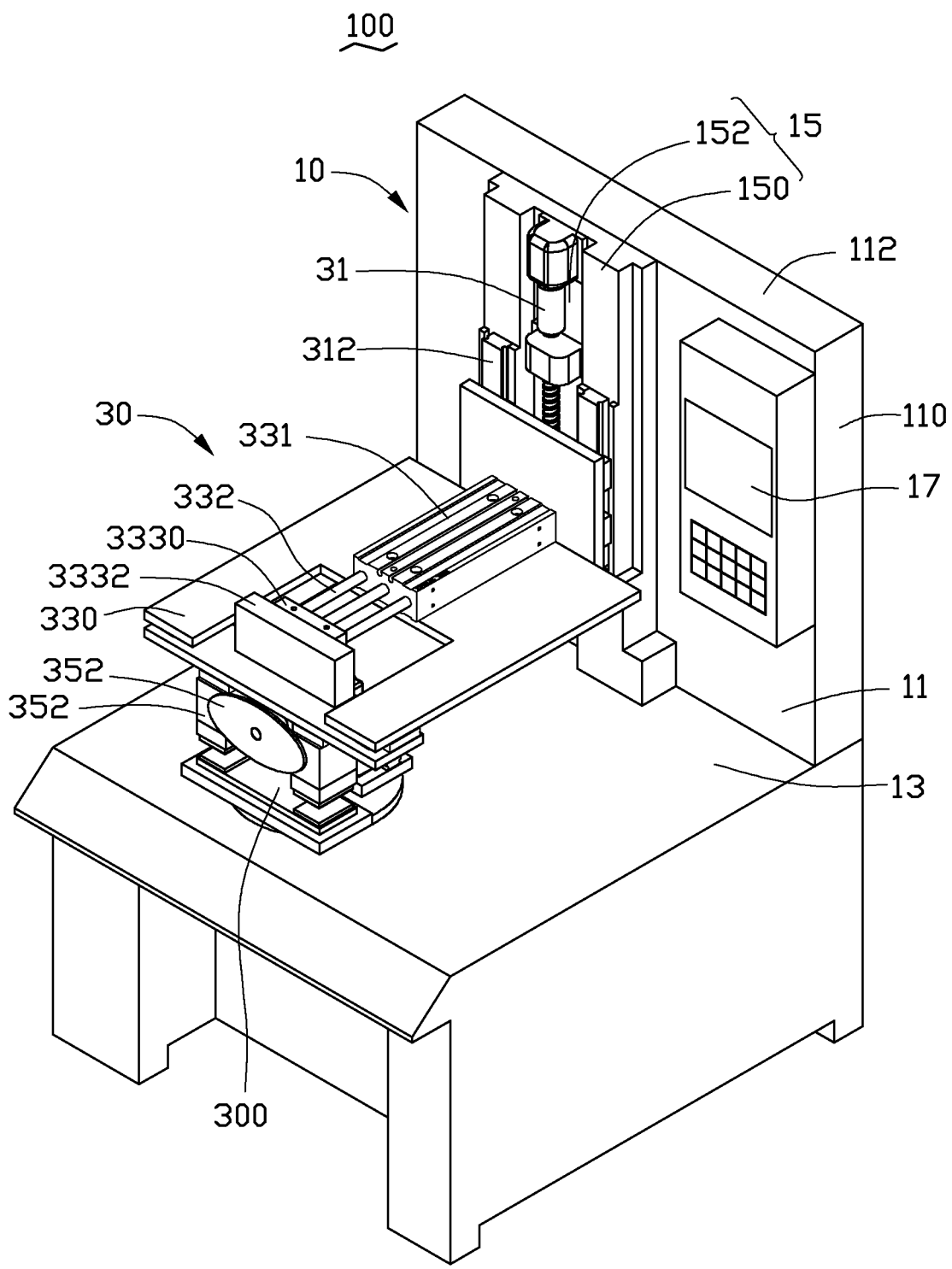
FIG. 1 is an isometric view of an electronic apparatus.

FIG. 1, is an electronic apparatus 100 in accordance with an embodiment. The electronic apparatus 100 is used for automatically procuring and installing an object 200 (see FIG. 2) onto a product 300. The electronic apparatus 100 includes a base 10 and an automatic installation device 30 mounted on the base 10. The base 10 is adapted to position the product 300. The automatic installation device 30 is adapted to install the object 200 to the product 300.

The base 10 includes a fixing stage 11, a placement stage 13 perpendicularly connected to the fixing stage 11, a mounting component 15, and an operating component 17. The fixing stage 11 is a substantially square-shaped flat stage, and includes a first rim 110 and a second rim 112 perpendicular to the first rim 110. The first rim 110 is perpendicular to the placement stage 13, and the second rim 112 is parallel to the placement stage 13. The mounting component 15 is placed in the middle portion of the fixing stage 11, and includes two narrow strip-shaped fixing portions 150 and a receiving portion 152 located between the two fixing portions 150. The two fixing portions 150 are perpendicular to the placement stage 13 but spaced apart. The receiving portion 152 is a groove defined between the two fixing portions 150. The operating component 17 is positioned on a side of the fixing stage 11 adjacent to the first rim 110 for controlling the automatic installation device 30.

Figure 2:
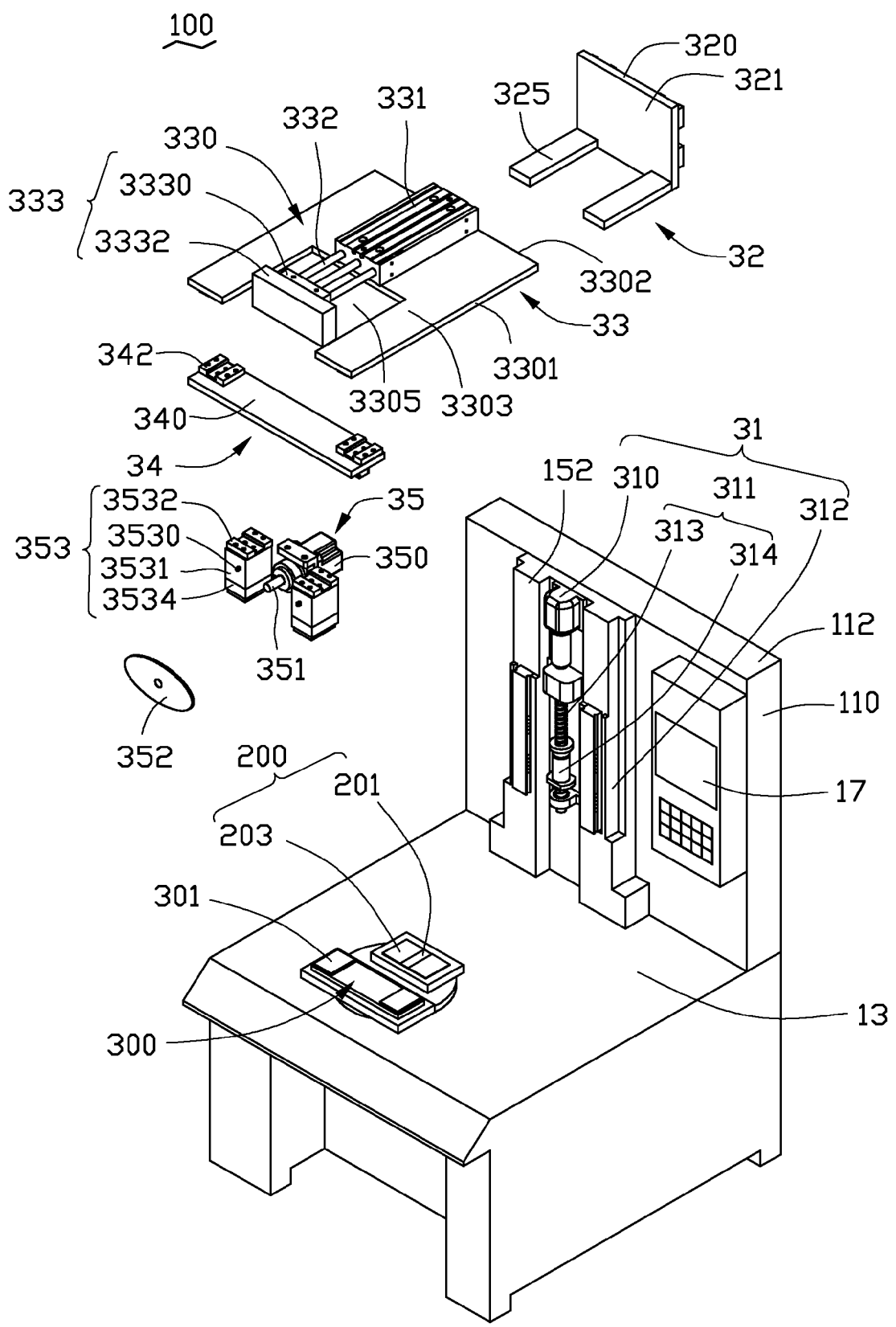
FIG. 2 is a partial, exploded view of the electronic apparatus of FIG. 1.
Figure 3:
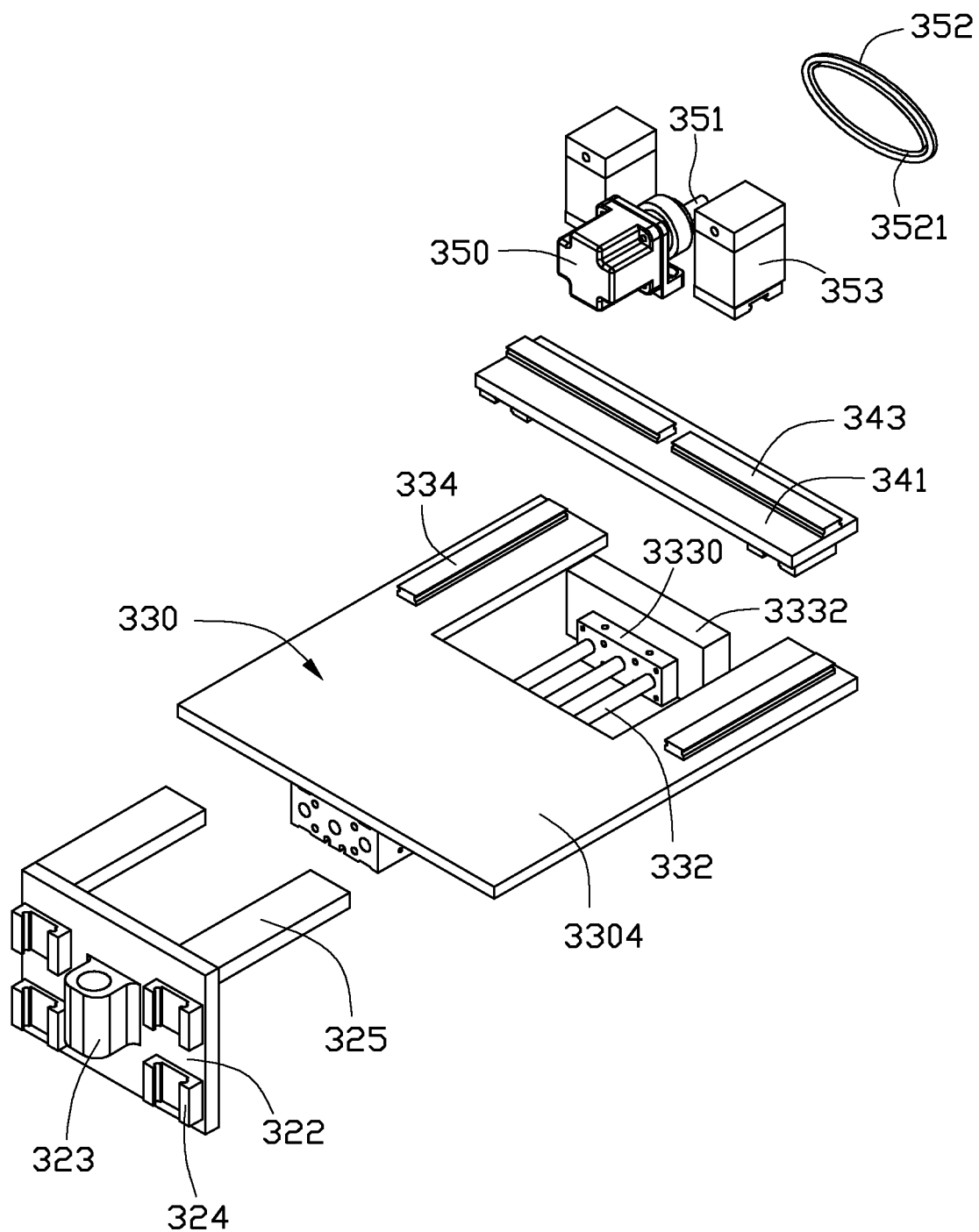
FIG. 3 is a partial, exploded view of the electronic apparatus of FIG. 2 from another aspect.

Referring to FIGS. 2 and 3, the automatic installation device 30 includes an elevating mechanism 31, a first connecting component 32, a flexing mechanism 33, a second connecting component 34 and a loading mechanism 35. The elevating mechanism 31 is fixed to the mounting component 15. The first connecting component 32 is secured to the elevating mechanism 31 and is capable of being driven by the elevating mechanism 31 to slide in the direction parallel to the first rim 110 relative to the two fixing portions 150. The flexing mechanism 33 is fixed to the first connecting component 32. The second connecting component 34 connects the flexing mechanism 33 with the loading mechanism 35.

The elevating mechanism 31 is received in the receiving portion 152. The elevating mechanism 31 includes a drive motor 310, a lead screw 311, and two first sliding rails 312. The lead screw 311 includes a screw rod 313 and a nut 314 threaded on the screw rod 313. The driver motor 310 connects to one end of the screw rod 313. The driver motor 310 is used for driving the screw rod 313 to rotate. The first sliding rails 312 are substantially narrow strip-shaped. The first sliding rails 312 are mounted on the two installing portions 150 respectively and are perpendicular to the placement stage 13.

The first connecting component 32 includes a main body 320 having a first surface 321 and a second surface 322 opposite to the first surface 321, a sleeve 323, two pair of sliding blocks 324, and two supporting components 325. The second surface 322 faces the mounting component 15. The sleeve 323 is fixed to the second surface 322 and is parallel to the lead screw 311. The sliding blocks 324 are fixed to the second surface 322. The two pairs of the sliding blocks 324 are respectively positioned on opposite sides of the sleeve 323 and are symmetrical with each other relative to the sleeve 323. Two supporting components 325 are substantially narrow strip-shaped and are perpendicularly connected to the first surface 321.

The flexing mechanism 33 includes a mounting plate 330, a cylinder 331, a guiding post 332, a fixing component 333, and two spaced apart second sliding rails 334. The mounting plate 330 includes two opposite third rims 3301, a forth rim 3302, a first fixing surface 3303, and a second fixing surface 3304 opposite to the first fixing surface 3303. The two third rims 3301 are parallel to each other, and the forth rim 3302 perpendicularly connects between the two third rims 3301. The mounting plate 330 defines an opening 3305. The opening 3305 is substantially U-shaped, and recesses from a rim of the mounting plate 330 opposite to the forth rim 3302, for receiving the guiding post 332 and the fixing component 333.

The cylinder 331 is fixed on the first fixing surface 3303. The guiding post 332 is slidably received in the cylinder 331 and is parallel to the third rims 3301. The guiding post 332 is capable of being driven by the cylinder 331 to slide relative to the mounting plate 330. The fixing component 333 is secured to an end of the guiding post 332 protruding out of the cylinder 331. The fixing component 333 includes a first fixing portion 3330 and a second fixing portion 3332 connected to the first fixing portion 3330. The first fixing portion 3330 and the second fixing portion 3332 are substantially plate-shaped. The first fixing portion 3330 connects between the guiding post 332 and the second fixing portion 3332. The second sliding rails 334 are fixed to the second fixing surface 3304. The second sliding rails 334 are positioned on opposite sides of the opening 3305 and are parallel to the third rim 3301.

The second connecting component 34 is substantially narrow strip-shaped, and is positioned on the second fixing surface 3304 in the direction perpendicular to the third rim 3301. The second connecting component 34 includes a first connecting surface 340 and a second connecting surface 341 opposite to the first connecting surface 340. Two second sliding blocks 342 are fixed to opposite ends of the first connecting surface 340 for engaging with the corresponding second sliding rail 334. Two spaced apart third sliding rails 343 are fixed to the second connecting surface 341 and are perpendicular to the third rim 3301.

The loading mechanism 35 includes a driving component 350, a rotating shaft 351, an adjusting component 352 and two installing components 353. The adjusting component 352 is connected to the driving component 350 via the rotating shaft 351, for changing the distance between the two installing components 353. In the embodiment, the adjusting component 352 is a cam and defines an elliptic recess 3521. The two installing components 353 are suction cups, and are positioned on opposite sides of the driving component 350. Each installing component 353 is substantially rectangle-shaped, and includes a positioning portion 3530, a body 3531, a third sliding block 3532, and an adsorbing portion 3534. The third sliding block 3532 is mounted on one end of the body 3531 and is slidably connected to the corresponding second sliding rail 334. The positioning portion 3531 is secured to the 3532. The 3530 is secured to the 3531. The absorbing portion 3534 is mounted on the other end of the body 3531 opposite to the third block 3532. In the embodiment, the positioning portion 3534 is a protruding post positioned on the body 3531.

The object 200 and the product 300 are positioned on one end of the placement stage 13 away from the fixing stage 11 and are aligned with each other. The object 200 is positioned between the product 300 and the fixing stage 11. In the embodiment, the object 200 includes a first object and a second object which are two double faced adhesive tapes 203 glued on opposite ends of a protecting paper 201. The product 300 includes two gluing portions 301 corresponding to the two double faced adhesive tapes 203 respectively. The two gluing portions 301 are positioned on opposite ends of the product 300. The distance between the two gluing portions 301 is different from the distance between the two double faced adhesive tapes 203. In the embodiment, the distance between the two gluing portions 301 is longer than the distance between the two double faced adhesive tapes 203.

In assembly, the drive motor 310 is received in the receiving portion 152 near the second rim 112, and one end of the lead screw 311 is connected to the drive motor 310. The two first sliding rails 312 are mounted on the corresponding fixing portion 150 and parallel to the first rim 110. The sleeve 323 of the first connecting component 32 is sleeved on the nut 314 of the lead screw 311, and the two first sliding blocks 324 are slidably connected to the corresponding sliding rail 324, thereby securing the first surface 321 of the first connecting component 32 on the lead screw 311.

The mounting plate 330 is fixed to the two supporting components 325 with the second sliding rail 334 facing the placement stage 13 and away from the first connecting component 32. The cylinder 331 is secured to the first mounting surface 3303 of the mounting plate 330. One end of the sliding rail 332 is slidably connected to the cylinder 331, and the other opposite end of the sliding rail 332 is connected to the fixing component 333. In this state, the mounting plate 330 is connected to the first connecting component 32. The sliding rail 332 is parallel to the third rim 3301 and is capable of sliding in a direction parallel to the third rim 3301 back and forth, by virtue of the cylinder 331.

The first connecting surface 340 of the second connecting component 34 is secured to the second fixing portion 3332, with the second sliding blocks 342 slidably connecting to the corresponding second sliding rail 334. The driving component 350 is secured on the second connecting component 34. The two installing components 353 are positioned on opposite ends of the driving component 350, with the third sliding blocks 3532 slidably connected to the corresponding third sliding rail 343. The rotating shaft 351 is rotatably connected to the driving component 350. The elliptic recess 3521 of the adjusting component 352 faces the two installing components 353, with the positioning portions 3530 being received in the elliptic recess 3521. After initial assembly, the loading mechanism 35 is on the top of the product 300, and the object 200 is positioned between the product 300 and the fixing stage 11. In this state, the two installing components 353 are received in opposite ends of the macro-axis of the elliptic recess 3521.

Figure 4:
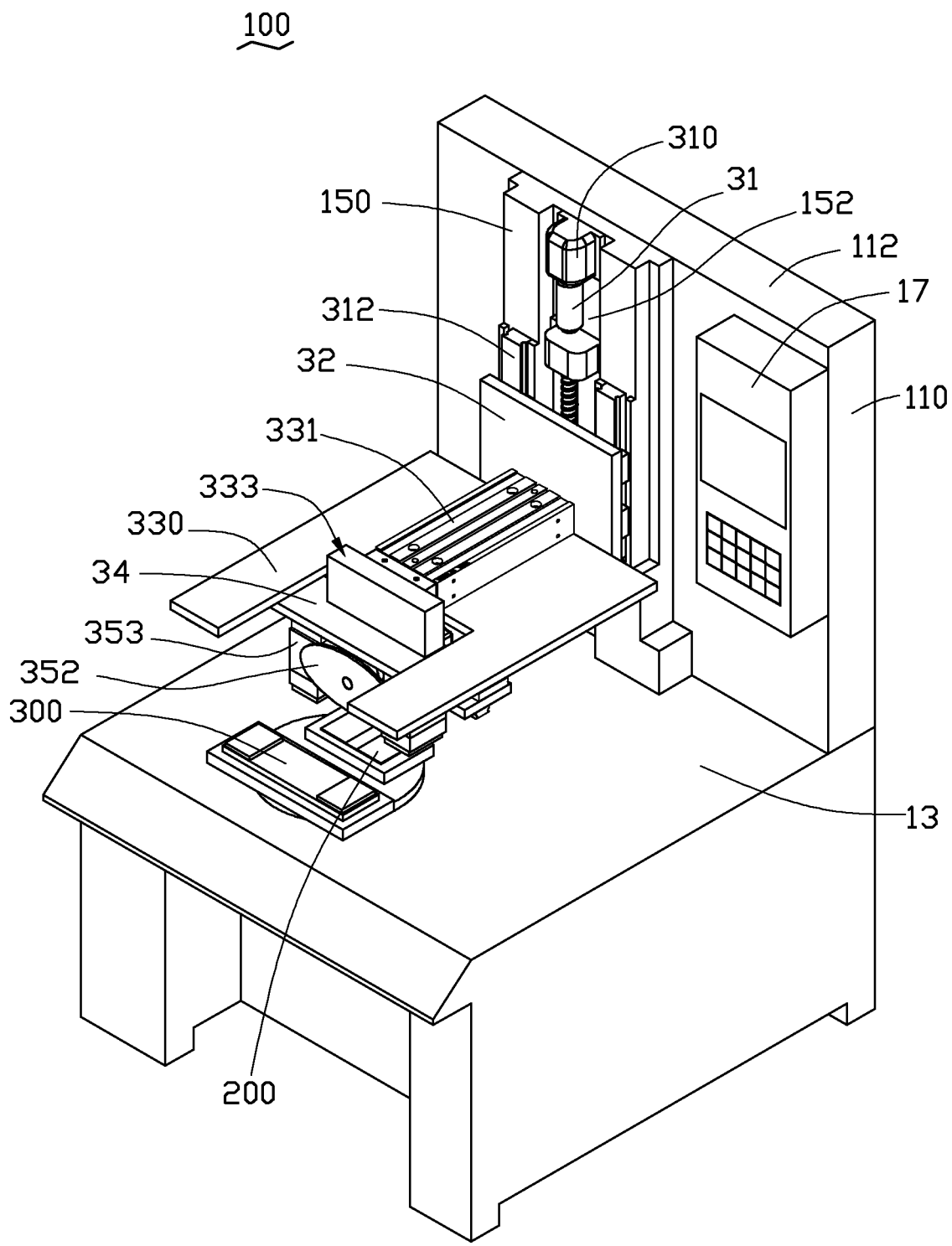
FIG. 4 is an isometric view of an electronic apparatus of FIG. 1 in a first state.
Figure 5:
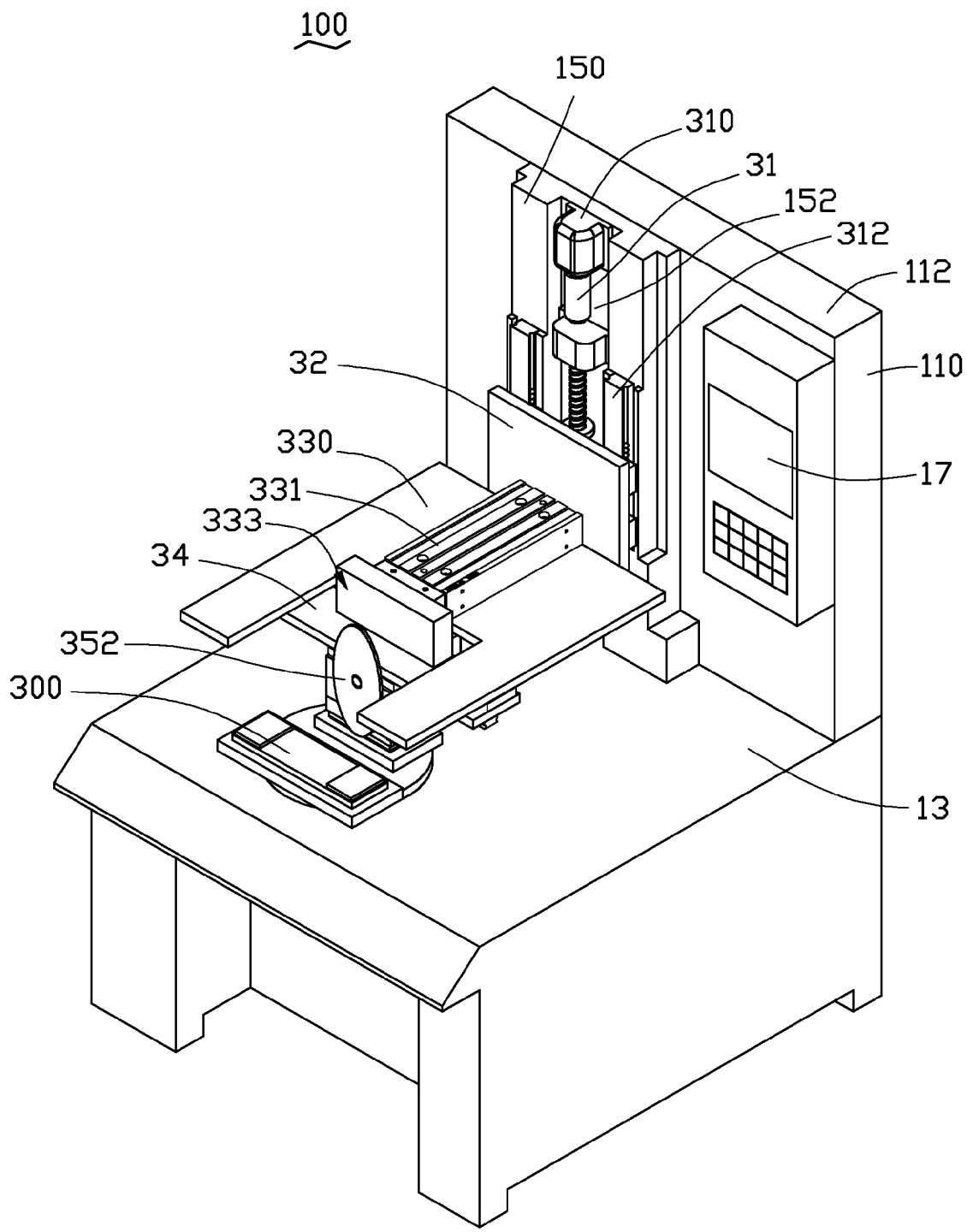
FIG. 5 is an isometric view of an electronic apparatus of FIG. 1 in a second state.
Figure 6:
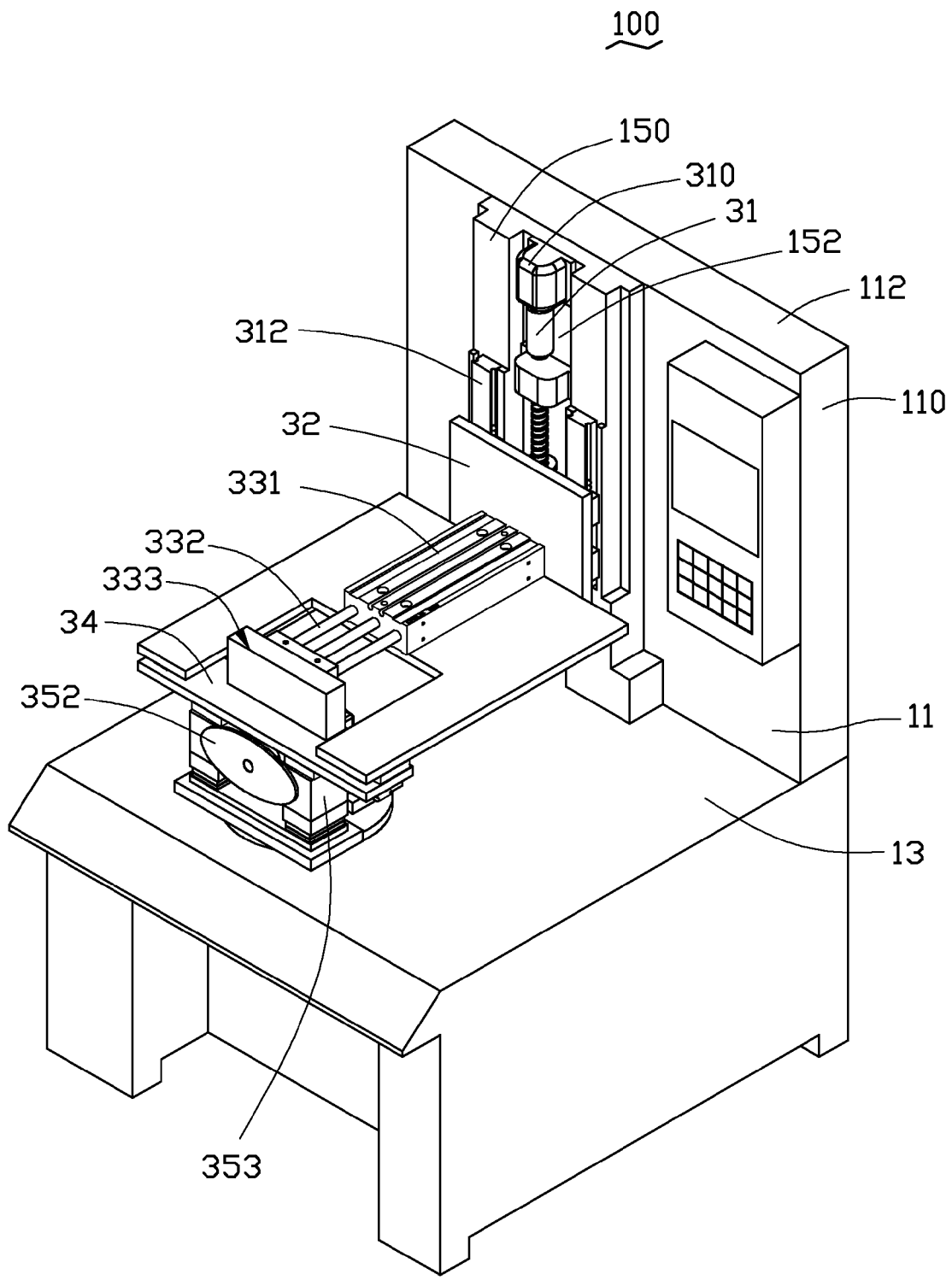
FIG. 6 is an isometric view of an electronic apparatus of FIG. 1 in a third state.

Referring to FIGS. 4, 5, and 6, when installing the object 200 on the product 300. The cylinder 331 drives the guiding post 332 to slide perpendicular to the fixing stage 11 under the control of the operating component 17. The loading mechanism 35 moves in a first orientation parallel to the placement stage 13 and above the two double faced adhesive tapes 203. The driving component 350 rotates the adjusting component 352 to slide the two installing components 353 to opposite ends of the minor-axis elliptic recess 3521 in a second orientation perpendicular to the first orientation, by virtue of the elliptic recess 3521 engaging with two positioning portions 3534. Then, the driving motor 310 rotates the lead screw 311 in a first direction (such as clockwise) under the control of the operating component 17, to drive the sleeve 323 and the nut 314 to move in the direction perpendicular to the placement stage 13. The loading mechanism 35 moves in a second orientation perpendicular to the placement stage 13 and approaches the placement stage 13. In this state, the two installation components 353 face the two double faced adhesive tapes 203 and are capable of adhering the corresponding double faced adhesive tapes 203 on the adsorbing portion 3530.

When the two double faced adhesive tapes 203 are absorbed on the corresponding installing component 353, the driving motor 310 rotates the lead screw 311 in a second direction reverse to the first direction (such as anticlockwise), to drive the loading mechanism 35 moving away from the placement stage 13. The cylinder 331 drives the guiding post 332 to slide away from and perpendicular to the fixing stage 11, such that the loading mechanism 35 is driven to slide to and above the product 300. Then, the two installing components 353 are moved to the corresponding gluing portion 301 by the driving component 350. Finally, the double faced adhesive tape 203 is glued to the gluing portion 301 by the driving motor 310. As a result, the object 200 is installed on the product 300.

It is noteworthy that, the shape of the elliptic recess 3521 may be other shape with unequal width. The installing component 353 may be other components for procuring the object 200, and the object 200 may be other objects fixed to the product 300. The position of the elevating mechanism 31, the first connecting component 32, the flexing mechanism 33, and the loading mechanism 35 may be adjusted according to the positions of the object 200 and the product 300.

Although information and the advantages of the present embodiments have been set forth in the foregoing description, together with details of the structures and functions of the present embodiments, the disclosure is illustrative only; changes may be made in detail, especially in the matters of shape, size, and arrangement of parts within the principles of the present embodiments to the full extent indicated by the broad general meaning of the terms in which the appended claims are expressed.

What is claimed is:

1. An electronic apparatus, for automatically procuring and fixing an object to a product, the electronic apparatus comprising:
    a base for positioning the object and the product; and
    an automatic installation device mounted on the base, the automatic installation device comprising;
        an elevating mechanism mounted on the base;
        an loading mechanism for procuring the object; and
        a flexing mechanism connected between the elevating mechanism and the loading mechanism;
    wherein when the flexing mechanism drives the loading mechanism moving in a first orientation, the loading mechanism is moveable between the object and the product for aligning the object with the product; when the object is aligned with the product, the elevating mechanism drives the loading mechanism and the flexing mechanism moving in a second orientation perpendicular to the first orientation to fix the object to the product; the elevating mechanism comprises a driving motor secured to the base, a lead screw rotatable secured to the base and connected to the driving motor, the driving motor is capable of rotating the lead screw, the automatic installation device further comprises a first connecting component movably coupled to the lead screw, the first connecting component comprises a sleeve sleeved on the lead screw; when the diving motor drives the lead screw to rotate, the sleeve is movable along the lead screw for driving the first connecting component moving in the second orientation.

2. The electronic apparatus as claimed in claim 1, wherein the flexing mechanism is capable of driving the loading mechanism to move in the first orientation to align the loading mechanism with the object, the elevating mechanism is capable of driving the loading mechanism to approach and procure the object in the second orientation.

3. The electronic apparatus as claimed in claim 1, wherein the flexing mechanism comprises a mounting plate secured to the first connecting component, a cylinder positioned on the mounting plate, and a guiding post slidably connected to the cylinder, when the cylinder drives the guiding post moving in the first orientation, the flexing mechanism is capable of driving the loading mechanism to move between the object and the product.

4. The electronic apparatus as claimed in claim 3, wherein the loading mechanism comprises an installing component connected to an end of the guiding post, when the guiding post moves in the first orientation, the installing component is capable of moving between the object and the product; when the first connecting component moves in the second orientation, the installing component is capable of absorbing the object and fixing the object to the product.

5. The electronic apparatus as claimed in claim 3, wherein the loading mechanism comprises an adjusting component, two installing components connected to an end of the guiding post and slidably secured to the adjusting component, the adjusting component is capable of rotating to drive the two installing components moving toward or away from each other.

6. The electronic apparatus as claimed in claim 5, wherein the loading mechanism comprises a driving component secured to the adjusting component, the two installing components are positioned on opposite sides of the adjusting component, the driving component is capable of rotating the adjusting component to drive the two installing components move toward or away from each other.

7. The electronic apparatus as claimed in claim 5, wherein the adjusting component is a cam and defines a recess with unequal width, each installing component comprises a positioning portion engaging with the recess; when the driving component drives the adjusting component to rotate, the sidewall of the recess drives the positioning portions sliding along the locus of the recess for driving the two installing components moving toward and away from each other.

8. The electronic apparatus as claimed in claim 7, wherein the recess of the adjusting component is elliptic-shaped, when the two fixing components move away from each other, the positioning portions resist opposite ends of the macro-axis of the recess; when the two fixing components move toward each other, the positioning portions resist opposite ends of the minor-axis of the recess.

9. The electronic apparatus as claimed in claim 5, wherein the automatic installation device comprises a second connecting component connected to an end of the guiding post, the two installing components slidably secured to the second connecting component.

10. The electronic apparatus as claimed in claim 9, wherein the flexing mechanism comprises a fixing component secured to an end of the guiding post, the second connecting component is secured to the fixing component, the second connecting component comprises a second sliding block, the mounting plate comprises a second sliding rail engaging with the second sliding block.

11. An automatic installing device, for procuring and fixing an object to a product and mounted on a base, the automatic installation device comprising:
    an elevating mechanism mounted on the base;
    an loading mechanism for procuring the object; and
    a flexing mechanism connected between the elevating mechanism and the loading mechanism;
    wherein when the flexing mechanism drives the loading mechanism moving in a first orientation, the loading mechanism is moveable between the object and the product for aligning the object with the product; when the object is aligned with the product, the elevating mechanism drives the loading mechanism and the flexing mechanism moving in a second orientation perpendicular to the first orientation to fix the object to the product; the elevating mechanism comprises a driving motor secured to the base, a lead screw rotatably secured to the base and connected to the driving motor, the automatic installation device comprises a first connecting component movably coupled to the lead screw, the first connecting component comprises a sleeve sleeved on the lead screw; when the diving motor drives the lead screw to rotate, the sleeve is movable along the lead screw up and down for driving the first connecting component moving in the second orientation.

12. The automatic installation device as claimed in claim 11, wherein the flexing mechanism is capable of driving the loading mechanism to move in the first orientation to align the loading mechanism with the object, the elevating mechanism is capable of driving the loading mechanism to approach and procuring the object in the second orientation.

13. The automatic installation device as claimed in claim 11, wherein the flexing mechanism comprises a mounting plate secured to the first connecting component, a cylinder positioned on the mounting plate, and a guiding post slidably connected to the cylinder, when the cylinder drives the guiding post moving in the first orientation, the flexing mechanism is capable of driving the loading mechanism to move between the object and the product.

14. The automatic installation device as claimed in claim 13, wherein the loading mechanism comprises an adjusting component, two installing components connected to an end of the guiding post and slidably secured to the adjusting component, the adjusting component is capable of rotating to drive the two installing components moving toward and away from each other.

15. The automatic installation device as claimed in claim 14, wherein the adjusting component is a cam and defines a recess with unequal width, each installing component comprises a positioning portion engaging with the recess; when the driving component drives the adjusting component to rotate, the sidewall of the recess drives the positioning portions sliding along the locus of the recess for driving the two installing components to move toward and away from each other.

16. The automatic installation device as claimed in claim 15, wherein the recess of the adjusting component is elliptic-shaped, when the two fixing components move away from each other, the positioning portions resist opposite ends of the macro-axis of the recess; when the two fixing components move toward each other, the positioning portions resist opposite ends of the minor-axis of the recess.

17. The automatic installation device as claimed in claim 14, wherein the automatic installation device comprises a second connecting component, the two installing components are slidably secure to the second connecting component, the flexing mechanism comprises a fixing component secured to an end of the guiding post, the second connecting component is secured to the fixing component, the second connecting component comprises a second sliding block, the mounting plate comprises a second sliding rail engaging with the second sliding block.

* * * * *